(12) United States Patent
Li et al.

(10) Patent No.: US 11,002,469 B2
(45) Date of Patent: May 11, 2021

(54) INTEGRAL HEAT SUPERCONDUCTING PLATE HEAT EXCHANGER AND FABRICATION METHOD THEREFOR

(71) Applicant: ZHEJIANG JIAXI OPTOELECTRONIC EQUIPMENT MANUFACTURING CO., LTD., Zhejiang (CN)

(72) Inventors: Juqiang Li, Zhejiang (CN); Junqiang Yang, Zhejiang (CN); Aixing Tong, Zhejiang (CN)

(73) Assignee: ZHEJIANG JIAXI OPTOELECTRONIC EQUIPMENT MANUFACTURING CO., LTD., Zhejiang (CN)

( * ) Notice: Subject to any disclaimer, the term of this patent is extended or adjusted under 35 U.S.C. 154(b) by 334 days.

(21) Appl. No.: 15/739,991

(22) PCT Filed: Aug. 3, 2016

(86) PCT No.: PCT/CN2016/093063
§ 371 (c)(1),
(2) Date: May 21, 2018

(87) PCT Pub. No.: WO2017/020834
PCT Pub. Date: Feb. 9, 2017

(65) Prior Publication Data
US 2018/0266738 A1 Sep. 20, 2018

(30) Foreign Application Priority Data

Aug. 6, 2015 (CN) .......................... 201510476911.6

(51) Int. Cl.
F25B 39/02 (2006.01)
F28F 3/14 (2006.01)
(Continued)

(52) U.S. Cl.
CPC .............. *F25B 39/02* (2013.01); *B23P 15/26* (2013.01); *F28D 1/035* (2013.01);
(Continued)

(58) Field of Classification Search
CPC ....... F28F 2210/08; F28F 3/14; F25B 39/024; F25B 39/02; B23P 15/26; F28D 15/0275;
(Continued)

(56) References Cited

U.S. PATENT DOCUMENTS

| | | | | |
|---|---|---|---|---|
| 4,678,027 A | * | 7/1987 | Shirey | F25B 39/04 165/170 |
| 5,941,091 A | * | 8/1999 | Broadbent | F25B 39/024 165/135 |
| 6,050,330 A | * | 4/2000 | Schmit | B21D 51/18 165/133 |

FOREIGN PATENT DOCUMENTS

| | | |
|---|---|---|
| CH | 411005 A | 4/1966 |
| CN | 103277946 A * | 9/2013 |

(Continued)

*Primary Examiner* — Ana M Vazquez
(74) *Attorney, Agent, or Firm* — Global IP Services; Tianhua Gu

(57) ABSTRACT

An integrated thermal superconducting plate heat exchanger and a manufacturing method thereof. The integrated thermal superconducting plate heat exchanger comprises a heat exchange plate of a composite plate structure, a fluid pipe having a certain structure shape and a thermal superconducting pipe having a certain structure shape are formed in the heat exchange plate; two ends of the fluid pipe are formed with openings; and the thermal superconducting pipe is an enclosed pipe and is filled with a heat transfer working medium therein.

2 Claims, 6 Drawing Sheets

(51) Int. Cl.
    *F28D 15/02*    (2006.01)
    *H01L 23/373*   (2006.01)
    *H01L 23/46*    (2006.01)
    *F28D 1/03*     (2006.01)
    *B23P 15/26*    (2006.01)

(52) U.S. Cl.
    CPC ..... *F28D 15/0233* (2013.01); *F28D 15/0275* (2013.01); *F28D 15/0283* (2013.01); *F28F 3/14* (2013.01); *H01L 23/3736* (2013.01); *H01L 23/46* (2013.01); *F25B 39/024* (2013.01); *F28F 2210/08* (2013.01)

(58) Field of Classification Search
    CPC . F28D 15/0233; F28D 1/035; H01L 23/3736; H01L 23/46
    See application file for complete search history.

(56) References Cited

FOREIGN PATENT DOCUMENTS

| | | | |
|---|---|---|---|
| CN | 103277946 | A | 9/2013 |
| CN | 103394882 | A | 11/2013 |
| CN | 105004205 | A | 10/2015 |
| CN | 204944260 | U | 1/2016 |

\* cited by examiner

INTEGRAL HEAT SUPERCONDUCTING PLATE HEAT EXCHANGER AND FABRICATION METHOD THEREFOR

CROSS REFERENCE TO RELATED PATENT APPLICATION

The present application is the US national stage of PCT/CN2016/093063 filed on Aug. 3, 2016, which claims the priority of the Chinese patent application No. CN201510476911.6 filed on Aug. 6, 2015, which application is incorporated herein by reference.

BACKGROUND OF THE PRESENT INVENTION

Field of Invention

The present invention relates to a heat exchanger, and in particular relates to an integrated thermal superconducting plate heat exchanger and a manufacturing method thereof.

Description of Related Arts

Currently, a composite aluminum plate used for a heat exchanger mostly adopts a single-pipe system, wherein a fluid flows through a pipe on a plate from one end to another. The heat exchanger, which is connected to a circulation system for fluid heating or cooling and generally functions as a evaporator heat-absorbing component of a refrigerator, has the following main problems: due to the limitation of a coefficient of thermal conductivity (220 W/mk) of an aluminum material and the thickness of the plate, the thermal-conduction resistance is larger and a fluid pipe cannot cover a surface of the entire plate, temperatures of the entire plate surface of the composite plate of the heat exchanger are not uniform, the phenomenon of supercooling and superheating exists at local positions, and a heat exchange area of the entire evaporator cannot be fully used. Meanwhile since the pipe system is excessively long, flow resistance of the fluid in a conduit of the heat exchange plate is considerably large, resulting in a reduction in system energy efficiency.

A thermal superconducting plate is generally a combination of a phase-change suppressing heat transfer plate or a heat pipe with an aluminum plate. Due to fast heat transfer rate and good temperature uniformity, the thermal superconducting plate is generally used as a separate heat dissipation plate.

If the thermal superconducting plate and the plate heat exchanger with a piping system are composited together, and features of the thermal superconducting plate such as fast heat transfer rate and good temperature uniformity are used, properties of temperature uniformity and effective heat transfer of the plate heat exchanger can be realized only by placing some fluid communication pipes on the thermal superconducting plate, such that the length of the fluid pipe will be greatly shortened, the flow resistance, energy consumption and usage amount of fluid will be reduced, and thus the efficiency and coefficient of performance of the heat exchanger will be improved.

An object of the present invention is to provide a new high-efficiency thermal superconducting plate heat exchanger in which the thermal superconducting plate and the fluid pipe plate heat exchanger are composited together.

SUMMARY OF THE PRESENT INVENTION

In view of the above-mentioned defects in the prior art, an object of the present invention is to provide an integrated thermal superconducting plate heat exchanger and a manufacturing method thereof for solving the problems that due to the limitation of a coefficient of thermal conductivity and the thickness of an aluminum material, the thermal-conduction resistance is larger and a fluid pipe cannot cover a surface of the entire plate, temperatures of the entire plate surface of the composite plate of the heat exchanger are not uniform, the phenomenon of supercooling and superheating exists at local positions, and a heat exchange area of the entire evaporator cannot be fully used, and meanwhile since the pipe system is excessively long, flow resistance of the fluid in a conduit of the heat exchange plate is considerably large, resulting in a reduction in system energy efficiency in the prior art.

In order to realize the above object and other related objects, the present invention provides an integrated thermal superconducting plate heat exchanger, characterized in that the integrated thermal superconducting plate heat exchanger comprises a heat exchange plate with a composite plate structure, a fluid pipe having a certain structure shape and a thermal superconducting pipe having a certain structure shape are formed in the heat exchange plate;

Two ends of the fluid pipe are formed with openings which are adapted to be in communication with a fluid system for introducing a fluid into the fluid pipe; and the thermal superconducting pipe is an enclosed pipe and is filled with a heat transfer working medium therein.

As a preferred solution of the integrated thermal superconducting plate heat exchanger according to the present invention, the fluid pipe and the thermal superconducting pipe are formed through an inflation process, and a first projection structure corresponding to the thermal superconducting pipe and a second projection structure corresponding to the fluid pipe are formed on a surface of the heat exchange plate.

As a preferred solution of the integrated thermal superconducting plate heat exchanger according to the present invention, the first projection structure and the second projection structure are respectively formed on different surfaces of the heat exchange plate.

As a preferred solution of the integrated thermal superconducting plate heat exchanger according to the present invention, the heat exchange plate comprises a middle plate, a first plate and a second plate; the first plate, the middle plate and the second plate are successively stacked, the first plate and the second plate are located on two sides of the middle plate respectively and are composited with the middle plate through a rolling process;

the thermal superconducting pipe is located between the middle plate and the first plate, and the first projection structure is located on the first plate;

the fluid pipe is formed between the middle plate and the second plate, and the second projection structure is located on the second plate.

As a preferred solution of the integrated thermal superconducting plate heat exchanger according to the present invention, the first projection structure and the second projection structure are formed on the same surface of the heat exchange plate.

As a preferred solution of the integrated thermal superconducting plate heat exchanger according to the present invention, two surfaces of the heat exchange plate are formed thereon with the first projection structure and the second projection structure.

As a preferred solution of the integrated thermal superconducting plate heat exchanger according to the present invention, the heat exchange plate comprises a first plate and a second plate which are composited together through the rolling process; and the thermal superconducting pipe and the fluid pipe are located between the first plate and the second plate; and the first projection structure and the second projection structure are simultaneously located on the first plate, the second plate, or the first plate and the second plate.

As a preferred solution of the integrated thermal superconducting plate heat exchanger according to the present invention, a cross dimension of the thermal superconducting pipe is smaller than that of the fluid pipe.

The present invention further provides a manufacturing method of an integrated thermal superconducting plate heat exchanger, the manufacturing method comprises:

providing three plates, one of the plates being used as a middle plate and the other two plates being used as side-face plates; performing roughening on a single face of the side-face plates and performing roughening on both faces of the middle plate;

defining, through printing, shapes of a fluid pipe and a thermal superconducting pipe on two roughening faces of the middle plate;

placing the side-face plates on two sides of the middle plate, the roughening faces of the side-face plates and the middle plate being bonded and aligned, and riveted along edges;

heating the riveted three plates to a certain temperature and maintaining for a period of time, then performing a hot rolling process to form a composite plate;

filling the composite plate with a high-pressure fluid until the composite plate is expanded, and forming the fluid pipe and the thermal superconducting pipe inside the composite plate while respectively forming a first projection structure and a second projection structure on two surfaces of the composite plate; and filling a heat transfer working medium into the thermal superconducting pipe and sealing the thermal superconducting pipe.

The present invention further provides a manufacturing method of an integrated thermal superconducting plate heat exchanger, the manufacturing method comprises:

providing two plates, and performing roughening on a single face of the two plates;

defining, through printing, shapes of a fluid pipe and a thermal superconducting pipe on a roughening face of one of the plates;

bonding and aligning roughening faces of the two plates and performing riveting along edges;

heating the riveted two plates to a certain temperature and maintaining for a period of time, then performing a hot rolling process to form a composite plate;

filling the composite plate with a high-pressure fluid until the composite plate is expanded, and forming the fluid pipe and the thermal superconducting pipe inside the composite plate while forming a first projection structure and a second projection structure on two surfaces of the composite plate; and filling a heat transfer working medium into the thermal superconducting pipe and sealing the thermal superconducting pipe.

As described above, the integrated thermal superconducting plate heat exchanger and the manufacturing method thereof have the following advantageous effects: by combining the thermal superconducting pipe and the fluid pipe in the heat exchange plate of the integrated thermal superconducting plate heat exchanger and filling the heat transfer working medium into the thermal superconducting pipe, a phase-change suppressing heat transfer device is constituted and temperature uniformity of the heat exchange plate is improved; by using features of a thermal superconducting plate such as fast heat transfer rate and good temperature uniformity, a temperature difference between the heat transfer plate and air and an effective heat transfer area are increased, thereby greatly improving the heat dissipation capability and heat exchange efficiency of the heat exchange plate; and by enabling the integrated thermal superconducting plate heat exchanger to have properties of temperature uniformity and effective heat transfer, the length of the fluid pipe is greatly shortened, the flow resistance, energy consumption and usage amount of fluid are reduced, and thus the efficiency and coefficient of performance of the heat exchanger are improved.

Figure 1:
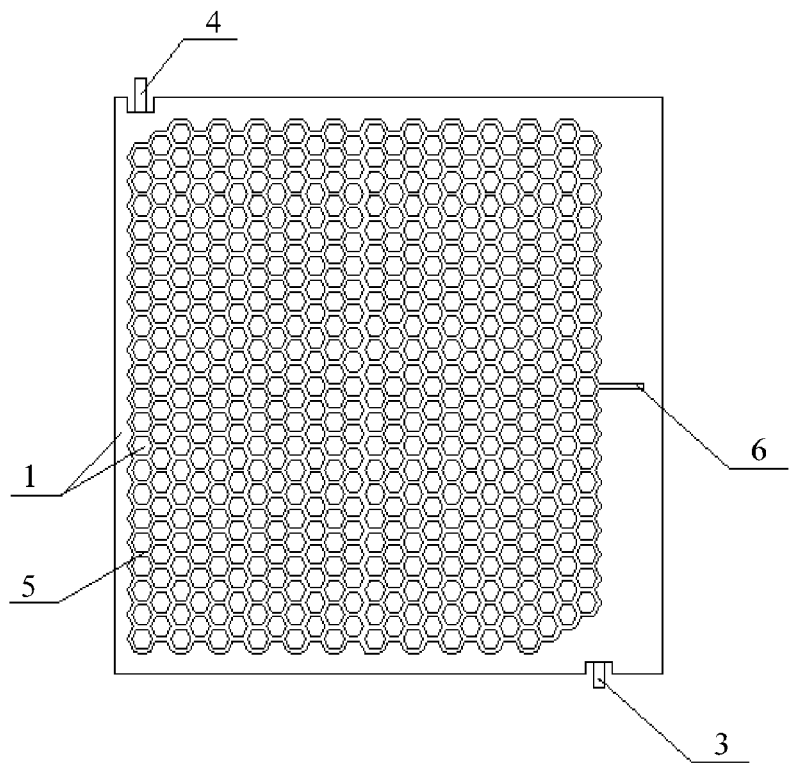
FIG. 1 illustrates a structural schematic view of a surface of a heat exchange plate having a thermal superconducting pipe which is in an interconnected hexagonal honeycomb shape in an integrated thermal superconducting plate heat exchanger provided by Embodiment 1 of the present invention.

DESCRIPTION OF COMPONENT MARK NUMBERS 1 non-conduit portion
2 fluid pipe
201 second projection structure
202 inner space of fluid pipe
3 fluid inlet nozzle
4 fluid outlet nozzle
5 thermal superconducting pipe
501 first projection structure
502 inner space of thermal superconducting pipe
503 heat transfer working medium
6 process opening
7 first plate
8 middle plate
9 second plate

DETAILED DESCRIPTION OF THE PREFERRED EMBODIMENTS

Hereinafter, embodiments of the present invention will be described through specific examples. Those skilled in the art will easily understand other advantages and functions of the present invention from the disclosure of the description. The present invention may also be implemented or applied by other different embodiments, and various details in the description may also be based on different opinions and applications, and various modifications and changes are made without departing from the spirit of the present invention.

Referring to FIGS. 1 to 9, it needs to be noted that, figures provided in the embodiments are merely used to illustratively describe basic concepts of the present invention, and therefore the figures only illustrate components related to the present invention rather than being drawn according to the numbers, shapes and sizes of the components during an actual implementation. The patterns, numbers and proportions of various components during the actual implementation may be randomly changed and the layout patterns of the components may also be more complicate.

Embodiment 1

Figure 2:
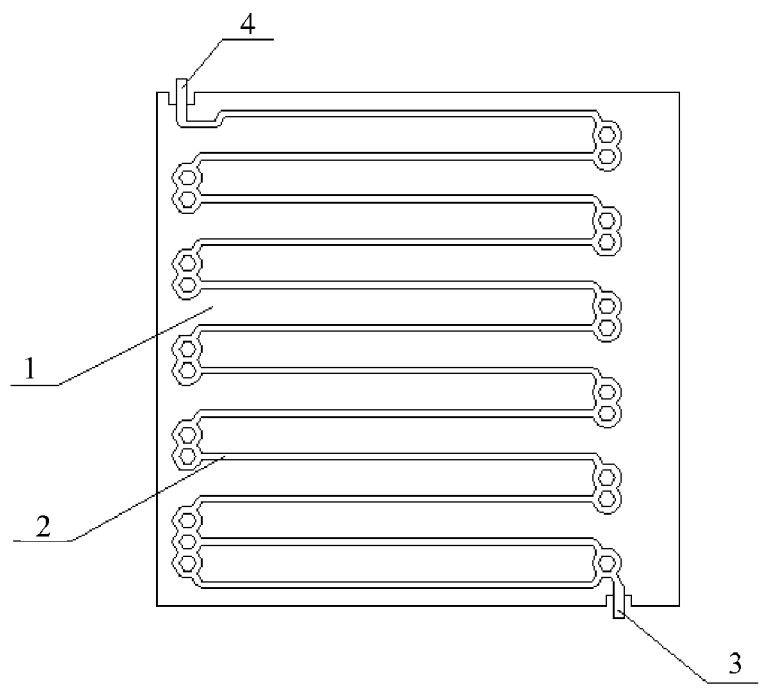
FIG. 2 illustrates a structural schematic view of a surface of a heat exchange plate having a fluid pipe which is of a single-in-single-out circulation structure in an integrated thermal superconducting plate heat exchanger provided by Embodiment 1 of the present invention.
Figure 3:
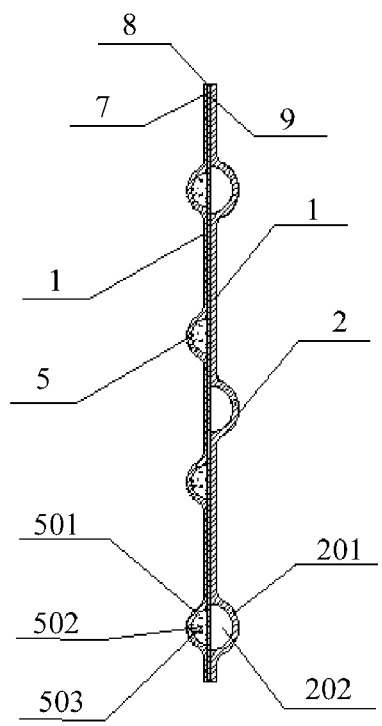
FIG. 3 illustrates a structural schematic view of partial cross-section of a heat exchanger plate in an integrated thermal superconducting plate heat exchanger provided by Embodiment 1 of the present invention.

Referring to FIG. 1 to FIG. 3, the present invention provides an integrated thermal superconducting plate heat exchanger, wherein the integrated thermal superconducting plate heat exchanger comprises a heat exchange plate of a composite plate structure, a two pipe system is provided in the heat exchange plate, a fluid pipe 2 with a certain structure shape and a thermal superconducting pipe 5 with a certain structure shape are formed in the heat exchange plate; two ends of the fluid pipe 2 are formed with openings which are adapted to be in communication with a fluid system through a fluid inlet nozzle 3 and a fluid outlet nozzle 4 for introducing a fluid into an inner space 202 of the fluid pipe 2; and the thermal superconducting pipe 5 is an enclosed pipe and an inner space 502 of the thermal superconducting pipe 5 is filled with a heat transfer working medium 503. By filling the heat transfer working medium 503 into the thermal superconducting pipe 5, a phase-change suppressing heat transfer device is formed and temperature uniformity of the heat exchange plate is improved.

As an example, the heat transfer working medium 503 is fluid, and preferably, the heat transfer working medium 503 may be gas, liquid, or a mixture of the gas and the liquid, and more preferably, the heat transfer working medium 503 is a mixture of the liquid and the gas.

As an example, the fluid pipe 2 and the thermal superconducting pipe 5 are formed through an inflation process, and a first projection structure 501 corresponding to the thermal superconducting pipe 5 and a second projection structure 201 corresponding to the fluid pipe 2 are formed on a surface of the heat exchange plate.

As an example, the first projection structure 501 and the second projection structure 201 are respectively formed on different surfaces of the heat exchange plate.

As an example, referring to FIG. 3, the heat exchange plate comprises a middle plate 8, a first plate 7 and a second plate 9; the first plate 7, the middle plate 8 and the second plate 9 are successively stacked, the first plate 7 and the second plate 9 are located on two sides of the middle plate 8 respectively and are composited with the middle plate 8 through a rolling process; the thermal superconducting pipe 5 is located between the middle plate 8 and the first plate 7, and the first projection structure 501 is located on the first plate 7; the fluid pipe 2 is formed between the middle plate 8 and the second plate 9, and the second projection structure 201 is located on the second plate 9. By combining the thermal superconducting pipe 5 and the fluid pipe 2 in the heat exchange plate of the integrated thermal superconducting plate heat exchanger and using features of the thermal superconducting plate 5 such as fast heat transfer rate and good temperature uniformity, a temperature difference between the heat transfer plate and air and an effective heat transfer area are increased, thereby greatly improving the heat dissipation capability and heat exchange efficiency of the heat exchange plate; and by enabling the integrated thermal superconducting plate heat exchanger to have properties of temperature uniformity and effective heat transfer, the length of the fluid pipe 2 is greatly shortened, the flow resistance, energy consumption and usage amount of fluid are reduced, and thus the efficiency and coefficient of performance of the heat exchanger are improved.

As an example, cross dimensions of the thermal superconducting pipe 5 and the fluid pipe 2 can be set according to actual requirements, and preferably, in the embodiment, the cross dimension of the thermal superconducting pipe 5 is smaller than that of the fluid pipe 2.

As an example, the thermal superconducting pipe 5 may be in a hexagonal honeycomb shape, a circular honeycomb shape, a quadrangular honeycomb shape, a plurality of U-shapes, diamonds, triangles or circular ring shapes that are connected in series, or any combination of any one or more of the above shapes.

FIG. 1 illustrates a structural schematic view of a surface of a heat exchange plate with a thermal superconducting pipe which is in an interconnected hexagonal honeycomb shape in an integrated thermal superconducting plate heat exchanger. As shown in FIG. 1, an edge portion and a hexagonal portion of the heat exchange plate are a non-conduit portion 1, the structures that surround various hexagonal shapes and communicate with each other are the thermal superconducting pipe 5. It needs to be noted that since the thermal superconducting pipe 5 is prepared through the inflation process, a process opening 6, i.e., a working medium filling opening, is formed on the heat transfer plate in the process of forming the thermal superconducting pipe 5. After the shape of the thermal superconducting pipe 5 is preliminary formed, the process opening 6 is sealed by means of welding, so as to realize sealing of the thermal superconducting pipe 5, such that the thermal superconducting pipe 5 is not conducted with outside.

It needs to be noted that, since the heat exchange plate comprises the middle plate 8, the first plate 7 and the second plate 9, the first plate 7, the middle plate 8 and the second plate 9 are successively stacked and are composited with together through the rolling process, a fluid inlet nozzle 3 and a fluid outlet nozzle 4 of the fluid pipe 2 are simultaneously schematically illustrated in FIG. 1.

As an example, the shape of the fluid pipe 2 may be a single-in-single-out circulation structure, or a double-in-double-out circulation structure, or a multiple-in-multiple-out circulation structure, for example, a trinary-in-trinary-out circulation structure, a quadruple-in-quadruple-out circulation structure, a quintuple-in-quintuple-out circulation structure, or a parallel circulation structure.

FIG. 2 is a structural schematic view of a surface of a heat exchange plate having a fluid pipe which is of a single-in-single-out circulation structure in an integrated thermal superconducting plate heat exchanger. As shown in FIG. 2, the shape of the fluid pipe 2 being a single-in-single-out circulation structure refers to that the fluid pipe 2 in the heat exchange plate is formed by bending one fluid pipe 2 into a certain shape, wherein a parallel narrow tube structure is the fluid pipe 2, and a portion between the fluid pipe 2 is the non-conduit portion 1. One end of the fluid pipe 2 is the fluid inlet nozzle 3 and the other end is the fluid outlet nozzle 4. The fluid inlet nozzle 3 and the fluid outlet nozzle 4 are copper joints or aluminum joints that are welded on openings at two ends of the fluid pipe 2 and connected with a fluid system.

As an example, materials of the heat transfer plates (i.e., materials of the middle plate 8, the first plate 7 and the second plate 9) should be materials having good thermal conductivity; preferably, in the embodiment, the materials of the heat transfer plates may be copper, copper alloy, aluminum, aluminum alloy, titanium and titanium alloy, or any combination of any one or more of the above-mentioned materials.

The operating principles of the integrated thermal superconducting plate heat exchanger are as follows: heat is quickly transferred from the fluid pipe 2 to the thermal superconducting pipe 5 when the fluid flows through the fluid pipe 2 of the heat exchange plate with latent heat, and since the thermal superconducting pipe 5 covers a surface of the entire heat exchange plate and has features of high heat transfer rate and high heat transfer density, the heat is quickly and evenly distributed on the entire heat exchange plate, a temperature difference between the heat transfer plate and air and an effective heat transfer area are increased, thereby greatly improving the heat dissipation capability and heat exchange efficiency of the heat exchange plate.

Embodiment 2

Figure 4:
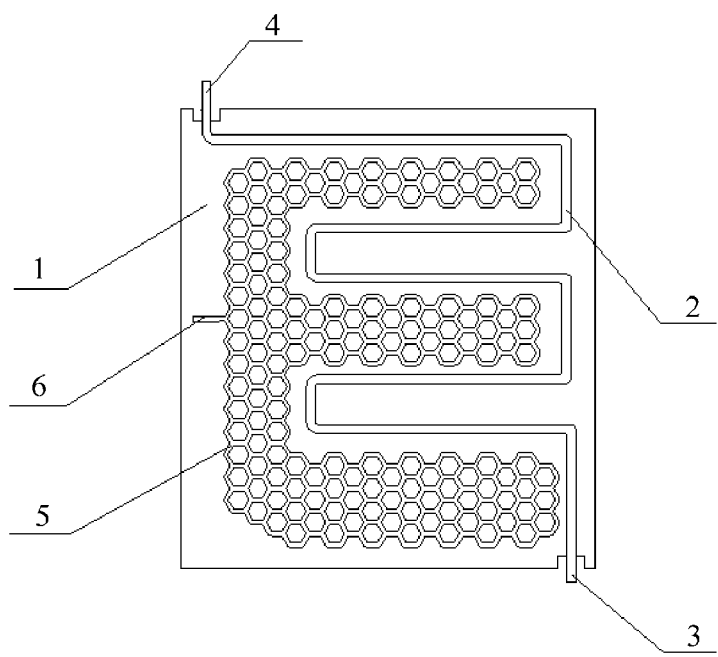
FIG. 4 illustrates a structural schematic view of a surface of a heat exchange plate having a thermal superconducting pipe which is in an interconnected hexagonal honeycomb shape and a fluid pipe which is of a single-in-single-out circulation structure in an integrated thermal superconducting plate heat exchanger provided by Embodiment 2 of the present invention.
Figure 5:
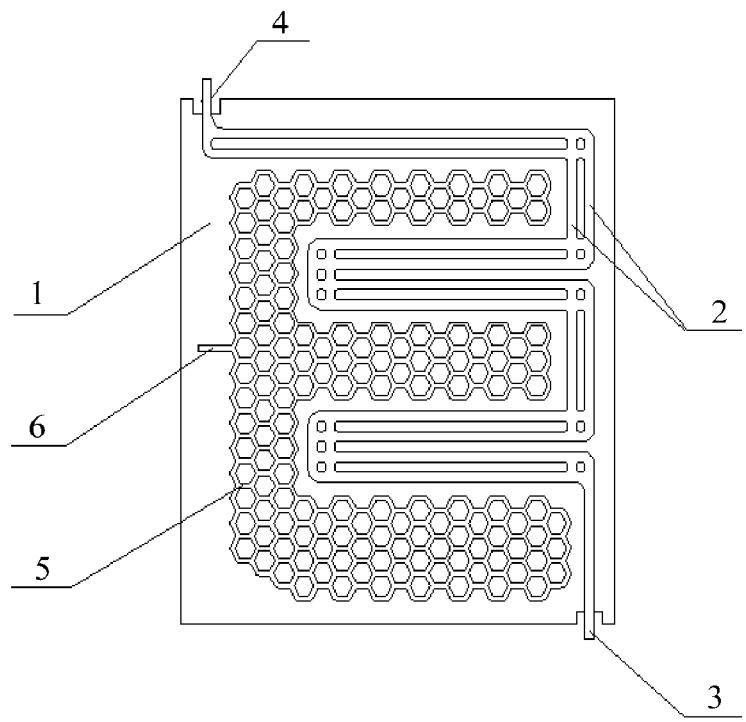
FIG. 5 illustrates a structural schematic view of a surface of a heat exchange plate having a thermal superconducting pipe which is in an interconnected hexagonal honeycomb shape and a fluid pipe which is of a double-in-double-out circulation structure in an integrated thermal superconducting plate heat exchanger provided by Embodiment 2 of the present invention.
Figure 6:
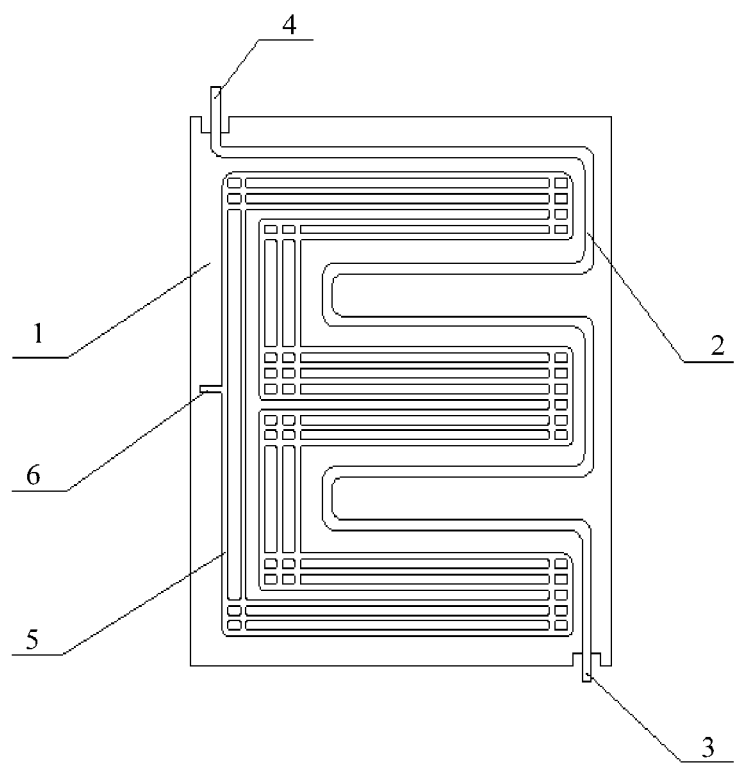
FIG. 6 illustrates a structural schematic view of a surface of a heat exchange plate having a thermal superconducting pipe which is of a multi-path communication structure and a fluid pipe which is of a single-in-single-out circulation structure in an integrated thermal superconducting plate heat exchanger provided by Embodiment 2 of the present invention.

Referring to FIG. 4 to FIG. 7, the present invention further provides an integrated thermal superconducting plate heat exchanger, the structure of the integrated thermal superconducting plate heat exchanger according to the present embodiment is substantially the same as that of the integrated thermal superconducting plate heat exchanger according to the Embodiment 1, and the integrated thermal superconducting plate heat exchanger according to the present embodiment differs from the integrated thermal superconducting plate heat exchanger according to Embodiment 1 in that: in Embodiment 1, the heat transfer plate comprises three layers of plates, i.e., the first plate 7, the middle plate 8 and the second plate 9, and the first projection structure 501 and the second projection structure 201 are respectively formed on different surfaces of the heat exchange plate; while in the present embodiment, the heat transfer plate comprises two layers of plates, i.e., the first plate 7 and the second plate 9, and the first projection structure 501 and the second projection structure 201 are formed on the same surface of the heat exchange plate. Herein, FIG. 4 is a structural schematic view of a surface of a heat exchange plate having a thermal superconducting pipe 5 which is in an interconnected hexagonal honeycomb shape and a fluid pipe 2 which is of a single-in-single-out circulation structure in the integrated thermal superconducting plate heat exchanger; FIG. 5 is a structural schematic view of a surface of a heat exchange plate 2 having a thermal superconducting pipe 5 which is in an interconnected hexagonal honeycomb shape and a fluid pipe 2 which is of a double-in-double-out circulation structure in the integrated thermal superconducting plate heat exchanger; and FIG. 6 is a structural schematic view of a surface of a heat exchange plate having a thermal superconducting pipe 5 which is of a multi-path communication structure and a fluid pipe 2 which is of a single-in-single-out circulation structure in the integrated thermal superconducting plate heat exchanger.

Figure 7:
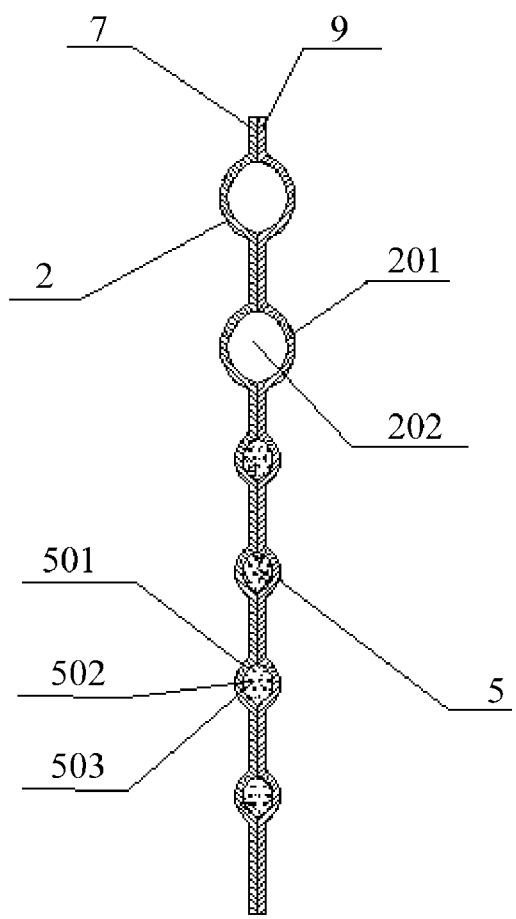
FIG. 7 illustrates a structural schematic view of partial cross-section of a heat exchanger plate in an integrated thermal superconducting plate heat exchanger provided by Embodiment 2 of the present invention.

As an example, referring to FIG. 7, the heat transfer plate comprise the first plate 7 and the second plate 9 which are composited together through a rolling process; the thermal superconducting pipe 5 and the fluid pipe 2 are located between the first plate 7 and the second plate 9; the heat transfer plate is in a two-face inflation form, the first projection structure 501 and the second projection structure 201 may be simultaneously located on the first plate 7 and the second plate 9, that is, two surfaces of the heat transfer plate are formed with the first projection structure 501 and the second projection structure 201.

As an example, the heat transfer plate may also be in a single-face inflation form, the first projection structure 501 and the second projection structure 201 may be simultaneously located on the first plate 7 or the second plate 9. When the first projection structure 501 and the second projection structure 201 are simultaneously located on the first plate 7, a surface of the second plate 9 is a plane; and when the first projection structure 501 and the second projection structure 201 are simultaneously located on the second plate 9, a surface of the first plate 7 is a plane.

Other structures and features of the integrated thermal superconducting plate heat exchanger in the present embodiment are the same as those of the integrated thermal superconducting plate heat exchanger in Embodiment 1, and reference can be made to Embodiment 1 for details, which are not repeatedly described herein.

Embodiment 3

Figure 8:
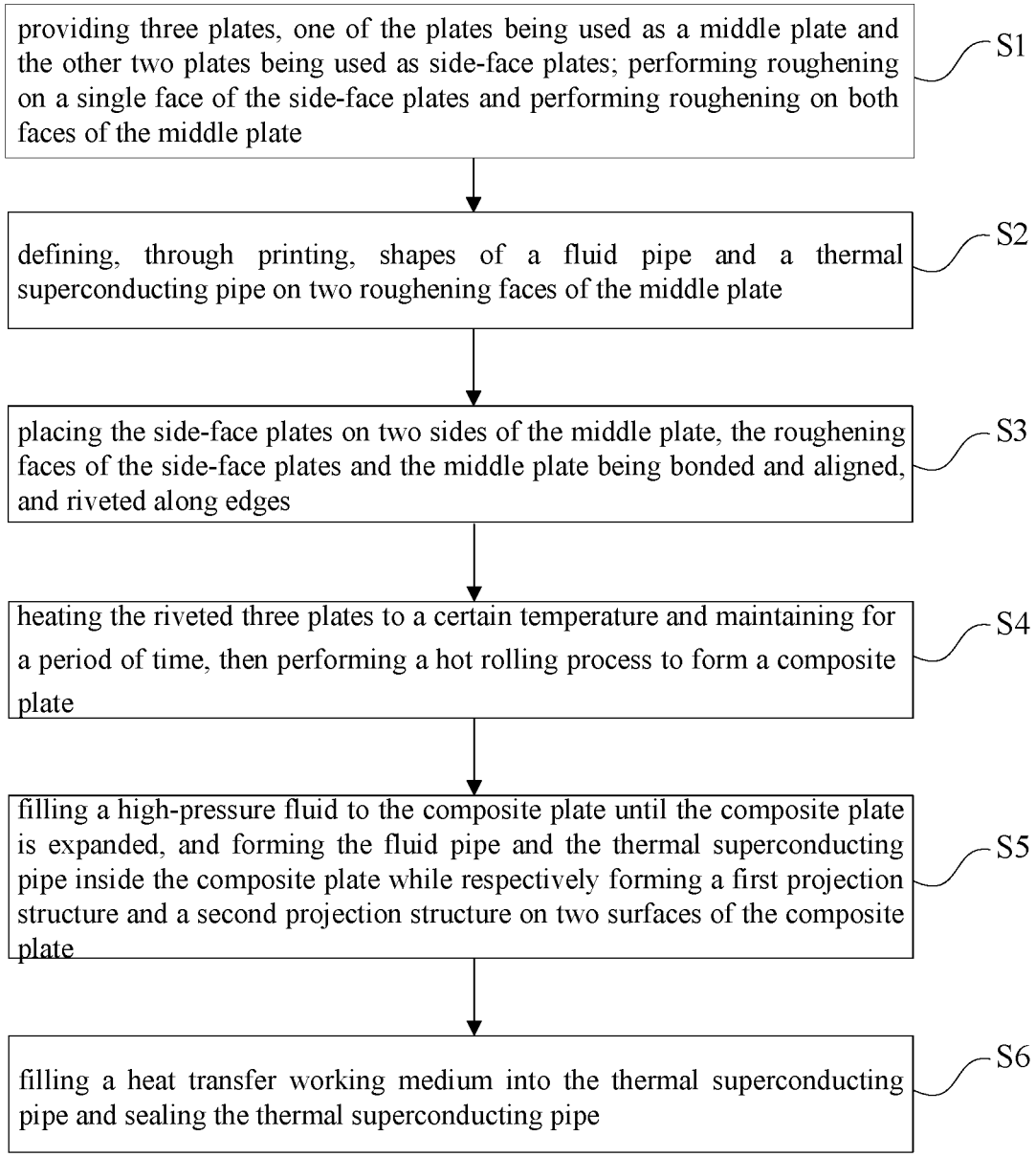
FIG. 8 illustrates a flow chart of a manufacturing method of an integrated thermal superconducting plate heat exchanger provided by Embodiment 3 of the present invention.

Referring to FIG. 8, the present invention further provides a manufacturing method of an integrated thermal superconducting plate heat exchanger, wherein the manufacturing method comprises:

S1: providing three plates, wherein the plates may be, but not limited to, aluminum plates, one of the plates is used as a middle plate and the other two plates are used as side-face plates; performing roughening on a single face of the side-face plates and blowing it clean, performing roughening on both faces of the middle plate and blowing them clean; and removing an oxide layer on the plate surface;

S2: using a graphite printing method to respectively form, on two roughening faces of the middle plate, graphite lines that are communicated with each other and have a certain shape, wherein the graphite lines located at two sides of the middle plate respectively define shapes of a fluid pipe and a thermal superconducting pipe;

S3: placing the side-face plates on two sides of the middle plate, the roughening faces of the side-face plates and the middle plate being bonded and aligned, and riveted along edges;

S4: placing the riveted three plates into a heating furnace for heating to a certain temperature and maintaining for a period of time, then transporting the riveted three plates to a rolling mill for rolling process to form a composite plate;

S5: filling, by using an expanding machine, high-pressure nitrogen to the composite plate until the composite plate is expanded, and forming the fluid pipe and the thermal superconducting pipe inside the composite plate while respectively forming a first projection structure and a second projection structure on two surfaces of the composite plate; and S6: filling a heat transfer working medium into the thermal superconducting pipe and sealing the thermal superconducting pipe; and welding a copper joint or an aluminum joint at two ports of the fluid pipe, wherein the copper joint or the aluminum joint is used for connection with a fluid system.

Other structures and features of the integrated thermal superconducting plate heat exchanger manufactured by the manufacturing method in the present embodiment are the same as those of the integrated thermal superconducting plate heat exchanger in Embodiment 1, and reference can be made to Embodiment 1 for details, which are not repeatedly described herein.

Embodiment 4

Figure 9:
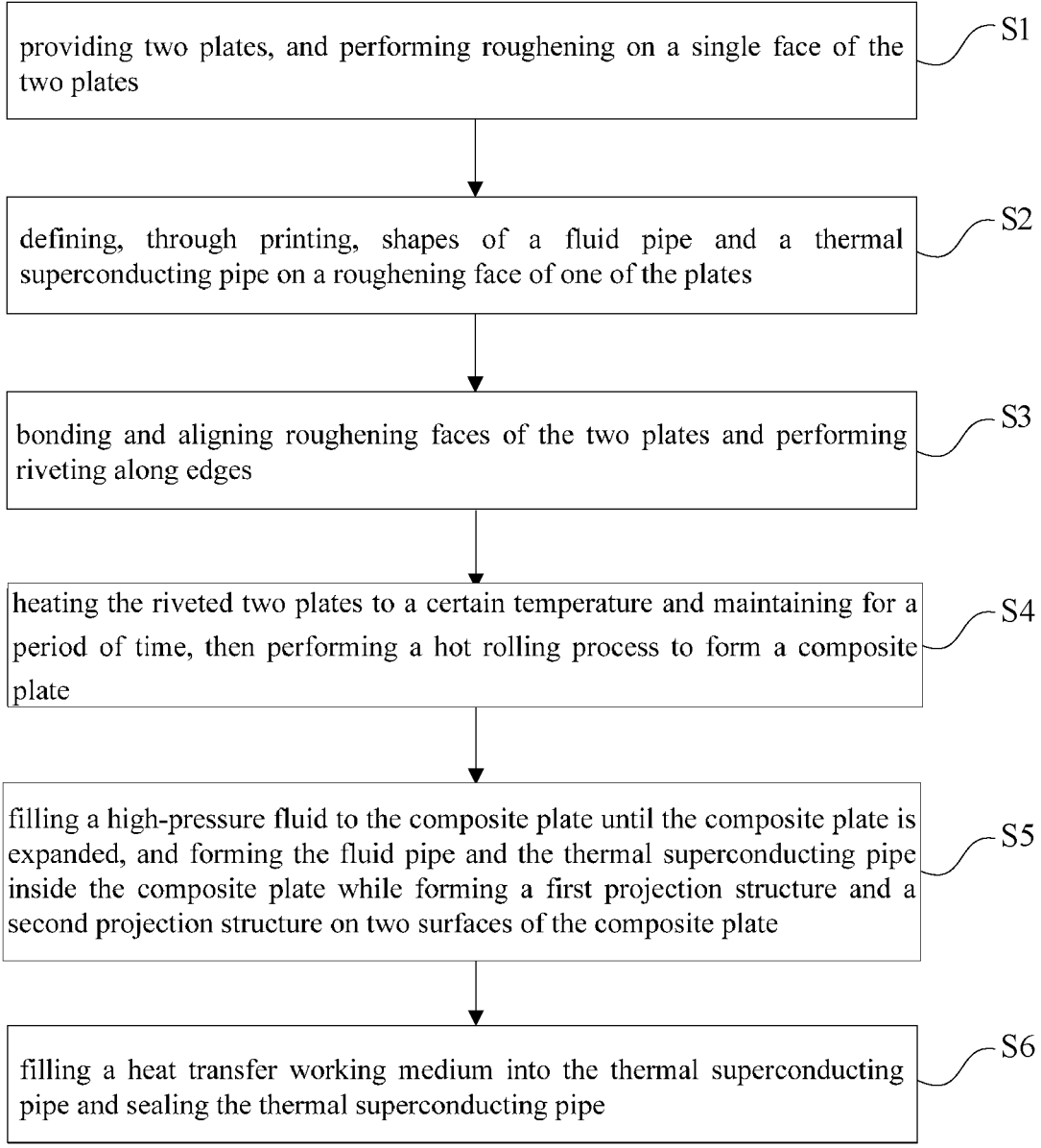
FIG. 9 illustrates a flow chart of a manufacturing method of an integrated thermal superconducting plate heat exchanger provided by Embodiment 4 of the present invention.

Referring to FIG. 9, the present invention further provides a manufacturing method of an integrated thermal superconducting plate heat exchanger, wherein the manufacturing method comprises:

S1: providing two plates, wherein the plates may be, but not limited to, aluminum plates, performing roughening on a single face of the two plates and blowing it clean, and removing an oxide layer on the plate surface;

S2: using a graphite printing method to form, on a roughening face of one of the plates, graphite lines having a certain shape, wherein the graphite lines define shapes of a fluid pipe and a thermal superconducting pipe;

S3: bonding and aligning roughening faces of the two plates and performing riveting along edges;

S4: placing the riveted two plates into a heating furnace for heating to a certain temperature and maintaining for a period of time, then transporting the riveted two plates to a rolling mill for rolling process to form a composite plate;

S5: filling, by using an expanding machine, high-pressure nitrogen to the composite plate until the composite plate is expanded, and forming the fluid pipe and the thermal superconducting pipe inside the composite plate while respectively forming a first projection structure and a second projection structure on two surfaces of the composite plate; and S6: filling a heat transfer working medium into the thermal superconducting pipe and sealing the thermal superconducting pipe; and welding a copper joint or an aluminum joint at two ports of the fluid pipe, wherein the copper joint or the aluminum joint is used for connection with a fluid system.

Other structures and features of the integrated thermal superconducting plate heat exchanger manufactured by the manufacturing method in the present embodiment are the same as those of the integrated thermal superconducting plate heat exchanger in Embodiment 2, and reference can be made to Embodiment 2 for details, which are not repeatedly described herein.

To sum up, the present invention provides an integrated thermal superconducting plate heat exchanger and a manufacturing method thereof. By combining the thermal superconducting pipe and the fluid pipe in the heat exchange plate of the integrated thermal superconducting plate heat exchanger and filling the heat transfer working medium in the thermal superconducting pipe, a phase-change suppressing heat transfer device is formed and temperature uniformity of the heat exchange plate is improved; by using features of the thermal superconducting plate such as fast heat transfer rate and good temperature uniformity, a temperature difference between the heat transfer plate and air and an effective heat transfer area are increased, thereby greatly improving the heat dissipation capability and heat exchange efficiency of the heat exchange plate; and by enabling the integrated thermal superconducting plate heat exchanger to have properties of temperature uniformity and effective heat transfer, the length of the fluid pipe is greatly shortened, the flow resistance, energy consumption and usage amount of fluid are reduced, and thus the efficiency and coefficient of performance of the heat exchanger are improved.

The above-described embodiment is merely used to illustratively describe the principle and function of the present invention and is not used to limit the present invention. Any person skilled in the art may make modifications or changes to the above-described embodiment without departing from the spirit and scope of the present invention. Hence, all equivalent modifications and changes made by those skilled in the art without departing from the spirit and technical concept of the present invention shall be included by the claims of the present invention.

What is claimed is:

1. A method for manufacturing an integrated thermal superconducting plate heat exchanger comprising:

a heat exchange plate with a composite plate structure comprising a middle plate, a first plate and a second plate, the first plate and the second plate are located on both sides of the middle plate respectively and are composited with the middle plate through a rolling process, a first projection structure is formed on the first plate and a second projection structure is formed on the second plate;

a thermal superconducting pipe formed between the first projection structure and the middle plate, the thermal superconducting pipe is an enclosed pipe and filled with a heat transfer working medium therein; and a fluid pipe formed between the second projection structure and the middle plate, the fluid pipe has two end-openings for communicating with a fluid system to introduce fluid into therein;

providing three plates, one of the plates being used as the middle plate and other two plates being used as the first and second plates; performing roughening on a single face of the first and second plates and performing roughening on both faces of the middle plate;

defining, through printing, shapes of the fluid pipe and the thermal superconducting pipe on two roughening faces of the middle plate;

placing the first and second plates on two sides of the middle plate, the roughening faces of the first and second plates and the middle plate being bonded and aligned, and riveted along edges;

heating the riveted three plates to a certain temperature and maintaining for a period of time, then performing a hot rolling process to form the composite plate structure;

filling a high-pressure fluid to the composite plate structure until the composite plate structure is expanded, and forming the fluid pipe and the thermal superconducting pipe inside the composite plate structure while respectively forming the first projection structure and the second projection structure on two surfaces of the composite plate structure; and filling the heat transfer working medium into the thermal superconducting pipe and sealing the thermal superconducting pipe.

2. A method for manufacturing an integrated thermal superconducting plate heat exchanger comprising:
- a heat exchange plate with a composite plate structure comprising a first plate and a second plate composited together through a rolling process, a first projection structure and a second projection structure are formed on the first plate;
- a thermal superconducting pipe formed between the first projection structure and the second plate, the thermal superconducting pipe is an enclosed pipe and filled with a heat transfer working medium therein;
- a fluid pipe formed between the second projection structure and the second plate, the fluid pipe has two end-openings for communicating with a fluid system to introducing fluid into therein;
- providing the first and second plates, and performing roughening on a single face of the first and second plates;
- defining, through printing, shapes of the fluid pipe and the thermal superconducting pipe on a roughening face of one of the first and second plates;
- bonding and aligning roughening faces of the first and second plates and performing riveting along edges;
- heating the riveted first and second plates to a certain temperature and maintaining for a period of time, then performing a hot rolling process to form the composite plate structure;
- filling a high-pressure fluid to the composite plate structure until the composite plate structure is expanded, and forming the fluid pipe and the thermal superconducting pipe inside the composite plate structure while forming the first projection structure and the second projection structure on two surfaces of the composite plate structure; and
- filling the heat transfer working medium into the thermal superconducting pipe and sealing the thermal superconducting pipe.

* * * * *